(12) United States Patent
Jitaru

(10) Patent No.: US 6,489,876 B1
(45) Date of Patent: Dec. 3, 2002

(54) METHOD AND APPARATUS FOR FORMING A MAGNETIC COMPONENT ON A PRINTED CIRCUIT BOARD

(75) Inventor: Ionel Jitaru, Tucson, AZ (US)

(73) Assignee: Ascom Energy Systems AG, Bern (CH)

( * ) Notice: Subject to any disclaimer, the term of this patent is extended or adjusted under 35 U.S.C. 154(b) by 0 days.

(21) Appl. No.: 09/668,620

(22) Filed: Sep. 22, 2000

(51) Int. Cl.[7] ................................................. H01F 5/00
(52) U.S. Cl. ...................... 336/200; 336/223; 336/232; 29/602.1; 29/605
(58) Field of Search ................... 29/602.1, 606; 336/200, 223, 232

(56) References Cited

U.S. PATENT DOCUMENTS

| 4,692,604 | A | | 9/1987 | Billings | |
|---|---|---|---|---|---|
| 4,873,757 | A | | 10/1989 | Williams | |
| 5,161,098 | A | | 11/1992 | Balakrishnan | |
| 5,319,342 | A | * | 6/1994 | Kuroki | 336/170 |
| 5,526,234 | A | * | 6/1996 | Vinciarelli et al. | 361/740 |
| 5,631,822 | A | * | 5/1997 | Silberkleit et al. | 363/144 |
| 5,661,647 | A | * | 8/1997 | Washburn et al. | 363/147 |
| 5,889,660 | A | * | 3/1999 | Taranowski et al. | 363/19 |
| 6,069,548 | A | * | 5/2000 | Baarman et al. | 336/65 |
| 6,073,339 | A | * | 6/2000 | Levin | 29/606 |
| 6,138,344 | A | * | 10/2000 | Roessler et al. | 29/606 |
| 6,144,281 | A | * | 11/2000 | Lorris | 336/200 |
| 6,175,727 | B1 | * | 1/2001 | Mostov | 455/307 |

* cited by examiner

Primary Examiner—Anh Mai
(74) Attorney, Agent, or Firm—Birdwell, Janke & Durando, PLC

(57) ABSTRACT

A method and apparatus for forming a magnetic component on a printed circuit board. The printed circuit board has at least one inner layer including a trace that forms a winding of the magnetic component. Another winding of the magnetic component is formed by a length of wire that is disposed externally to the printed circuit board.

14 Claims, 2 Drawing Sheets

METHOD AND APPARATUS FOR FORMING A MAGNETIC COMPONENT ON A PRINTED CIRCUIT BOARD

BACKGROUND OF THE INVENTION

The present invention relates to a method and apparatus for forming a magnetic component on a printed circuit board, such as a transformer or inductor.

The inventor's U.S. Pat. No. 5,973,923, incorporated by reference herein in its entirety, describes a packaging technology for power converters and power magnetics, wherein the windings of a magnetic element or component are incorporated on layers of a multiple layer printed circuit board. This concept has provided many advantages, including reducing the printed circuit board surface area that must be devoted to magnetic circuit components, and reducing the reactance associated with the leads of the magnetic component. As just one example, a particularly advantageous application of the concept is described in the inventor's U.S. Pat. No. 5,990,776, also incorporated by reference herein in its entirety. Notwithstanding the concept's many advantages, however, there are some practical limitations.

One limitation is that, especially where the windings are long, there may need to be many layers in the printed circuit board to carry the windings. However, the cost to fabricate the printed circuit board generally increases dramatically with the number of layers, so that it is usually desirable to minimize this number.

Another limitation is that the resistance of the traces may not be sufficiently well controlled in the standard printed circuit board fabrication process for a given application of the magnetic component. Precise control of the dimensions of the traces is typically not critical in printed circuit board fabrication; however it may become critical where the traces are employed as part of the magnetic component, especially where the windings of the component are long and their combined resistance becomes appreciable.

Accordingly, there is a need for a method and apparatus for forming a magnetic component on a printed circuit board that provides for reducing the cost of fabricating the circuit board as well as the completed assembly, and that provides for increased control over the electrical resistance of the magnetic components.

SUMMARY OF THE INVENTION

The method and apparatus for forming a magnetic component on a printed circuit board of the present invention solves the aforementioned problems and meets the aforementioned needs by providing a printed circuit board having at least one inner layer having a trace that forms a winding of the magnetic component. At least one other winding of the magnetic component is provided by a supplemental length of wire formed in a loop that is disposed externally to the printed circuit board. Each type of winding provides advantages, and the proportion of each may be selected to optimize cost and circuit parameters.

Therefore, it is a principal object of the present invention to provide a novel and improved method and apparatus for forming a magnetic component on a printed circuit board.

It is another object of the present invention to provide a method and apparatus for forming a magnetic component on a printed circuit board that provides for decreasing the manufacturing cost of the printed circuit board as well as the completed assembly.

It is still another object of the present invention to provide a method and apparatus for forming a magnetic component on a printed circuit board that provides for increasing control of critical component parameters, such as the resistance of the magnetic component.

It is yet another object of the present invention to provide such a method and apparatus that provides for decreasing parasitic electrical effects.

The foregoing and other objects, features and advantages of the present invention will be more readily understood upon consideration of the following detailed description of the invention, taken in conjunction with the following drawings.

DETAILED DESCRIPTION OF A PREFERRED EMBODIMENTS

Figure 1:
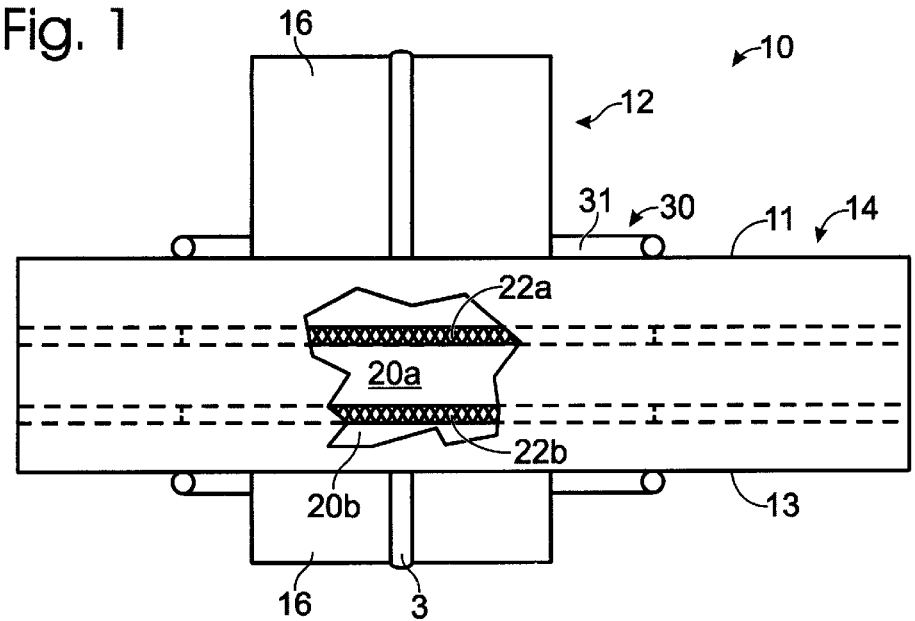
FIG. 1 is a side elevation of an apparatus for forming a magnetic component on a printed circuit board, according to the present invention.

Referring particularly to FIG. 1, an apparatus 10 for forming a magnetic component 12 on a printed circuit board 14 according to the present invention is shown. The magnetic component is shown as a transformer; however, the invention may be used for forming any magnetic component, the characteristic feature of which is a conductive pathway for carrying an electric current for generating a magnetic field of a controlled value for use in an electrical circuit. Typically, such magnetic components include a ferrite core element 16 to enhance the strength of the field by confining it locally and the field is produced for the purpose of storing energy in the circuit, as in an inductor, or to couple energy between two parts of the circuit, as in a transformer.

The printed circuit board (hereinafter "PCB") 14 has two external sides 11 and 13, and is provided with at least one inner layer, with two inner layers 20a and 20b being shown in FIG. 1. On each of these inner layers is a respective conductive trace 22a, 22b. The traces 22 are formed in the usual manner, e.g., by forming a pattern of photo resist on copper that has been plated or deposited on a given layer, and etching the copper where it is not protected by a covering of the photo resist. This generally creates a trapezoid shaped cross-section for the trace as the etchant undercuts the photo resist. If this is not appreciated, the cross-sectional area of the trace may be underestimated, resulting in underestimating its resistance. A more difficult problem, however, is that the etching process may not be sufficiently well controlled to fix the cross-sectional area of a given trace along its length to provide for use of the trace as part of a magnetic circuit component.

The traces 22 are formed as loops which may be spirals as discussed in U.S. Pat. No. 5,990,776. Each trace may be connected to another trace or to the external surfaces of the PCB through conductive vias, which are plated holes that extend between selected layers of the PCB. The traces are provided and coupled to one another through the vias so that a desired number of "turns" result in the magnetic component, the magnetic field resulting generally being proportional to this number.

Where all of the turns necessary in the magnetic component can be provided on the inner layers 20 without unduly compromising the cost of the circuit board or the performance of the magnetic component in its intended application, this is usually most desirable. However, it may be that either or both the cost of the PCB 14 and the performance of the magnetic component are unsatisfactory when all of the turns are provided on inner layers of the board. In that case, according to the present invention, not all of the turns that are desired for the magnetic component need be provided through traces on the inner layers of the board. Instead, some turns are provided on traces on inner layers such that, e.g., the tolerance in the combined resistance of the traces, or the acceptable cost of the circuit board, is not exceeded. Remaining turns required to complete the windings of the magnetic component are provided by supplemental wiring 30 external to the PCB 14.

Figure 2:
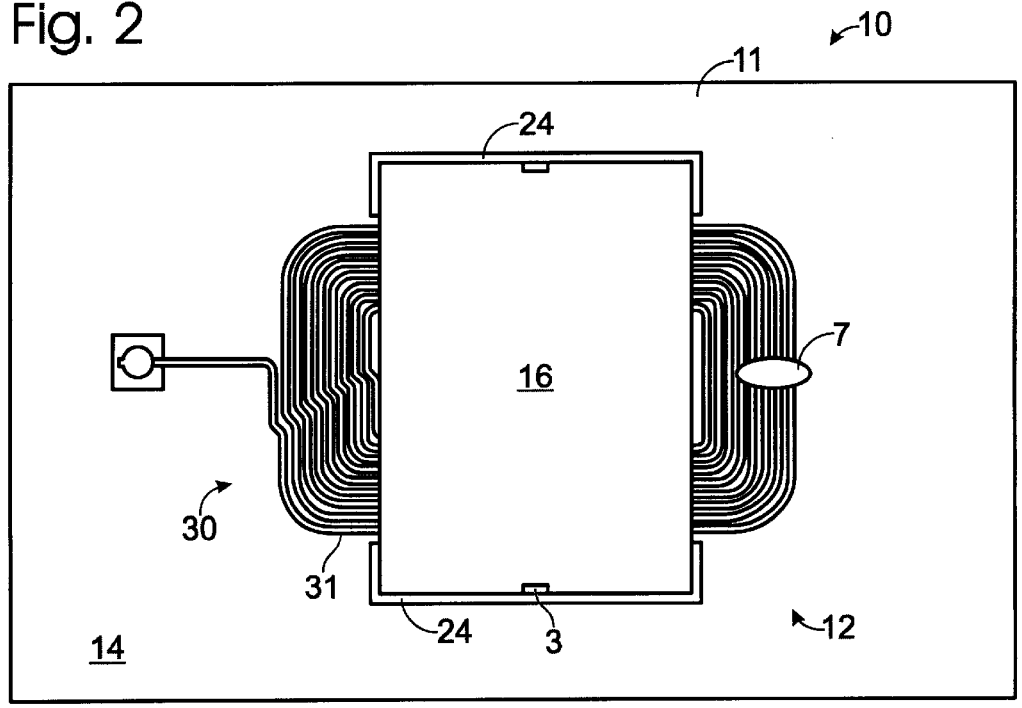
FIG. 2 is a plan view of the apparatus of FIG. 1.

The supplemental wiring 30 is preferably a length of insulated wire 31 that is disposed on the surface 11 or 13 in the form of a spiral as shown in FIG. 2. The wire provides a uniform and controlled resistance for the turns which it forms, and may do so at relatively low cost where, in the alternative, additional inner layers would otherwise be required in the PCB 14. The proportion of the windings of the magnetic component 12 that are provided on inner layers of the PCB with respect to windings provided on external surfaces of the PCB may be selected to provide any desired balance of the advantages provided by each type.

Figure 3:
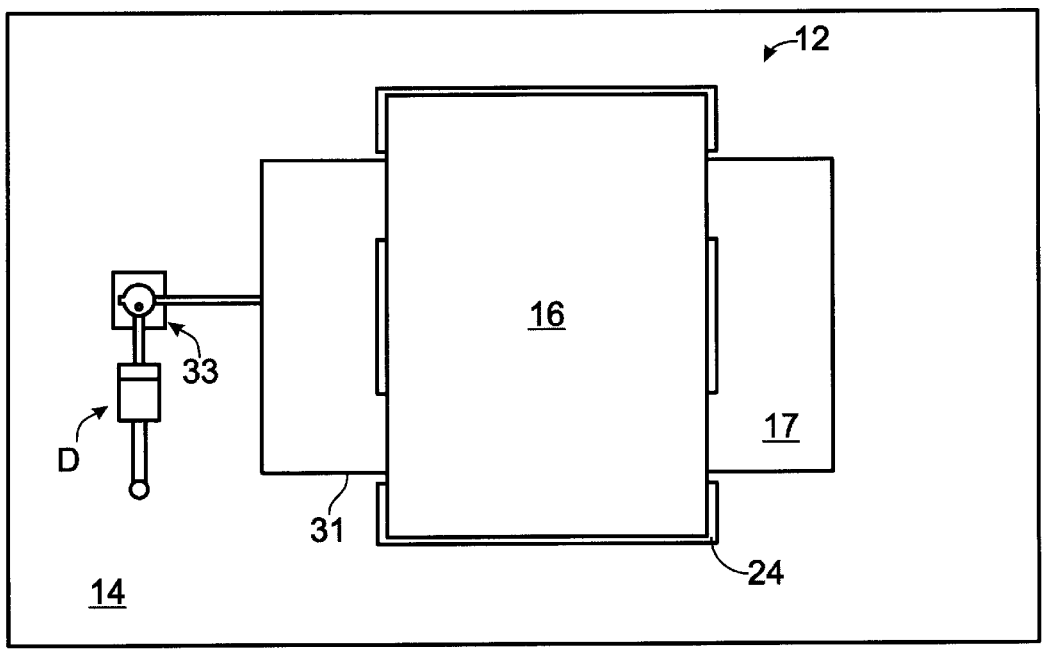
FIG. 3 is a plan view of the apparatus of FIG. 1 showing a shield according to the present invention.

The wire 31 may be tacked to the PCB 14 with an adhesive 7, or it may be fixed with respect to the PCB with any appropriate fastening means, such as clamps or ties. Preferably, the wire 31 is held against the sides of the PCB 14 by a thin, rigid material 17 as shown in FIG. 3. The material 17 may be attached to the PCB with an adhesive or other appropriate fastening means, such as threaded or snap fasteners.

Where the magnetic component 12 is a transformer, the traces may be formed on inner layers of the PCB 14 and the supplemental wiring 30 may be employed as one or the other of the primary and secondary windings. This is not essential to practice the invention, however. It is also advantageous to solder electrical components associated with the magnetic component 12, such as the diode "D" shown in FIG. 3, directly to the end 33 of the wire 31, to minimize parasitic effects.

Referring to either FIGS. 2 or 3, the PCB 14 includes cut-out areas 24 for receiving portions of the core element 16. Typically the core element 16 is provided in two halves, one of which is adapted to be installed from one of the external sides of the PCB, e.g., side 11 and protrude through the circuit board, through the cut-out areas 24, while the other half is adapted to mate therewith, being installed from the other external side of the PCB, here side 13, to form a closed pathway for the magnetic field. The two halves of the core element may be attached to one another with, e.g., screws or a clamp 3 shown.

Figure 4:
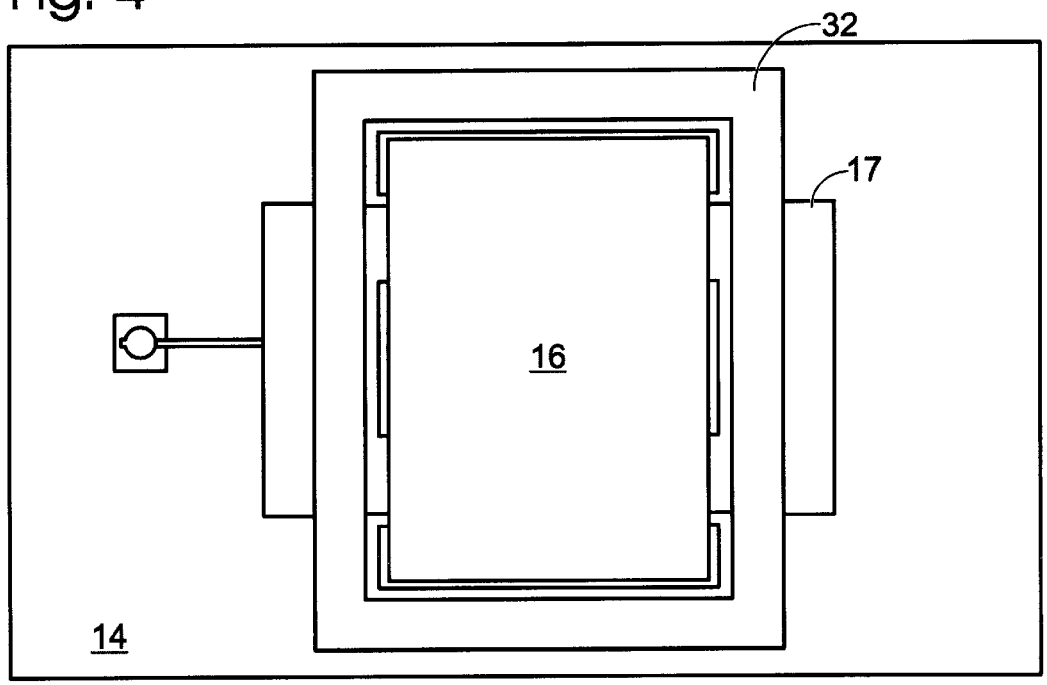
FIG. 4 is a plan view of the apparatus of FIG. 1 showing a short ring of conductive material according to the present invention.

Referring to FIG. 4, a shorting ring 32 of a conductive material such as a copper foil is provided around the core element 16 to short the leakage field emanating therefrom and thereby prevent it from affecting the operation of electrical or magnetic components disposed outside the ring. As is shown, the ring is spaced from the core element to prevent a direct electrical short. Preferably, the ring is provided on both sides of the PCB 14, and may be affixed to the PCB or directly to the insulated wire 31, or to the rigid material 17, with any known fastening means, such as any of the fastening means mentioned above.

It is to be recognized that, while a particular method and apparatus for forming a magnetic component on a printed circuit board has been shown and described as preferred, other configurations and methods could be utilized, in addition to those already mentioned, without departing from the principles of the invention. For example, traces on the external surfaces of the PCB 14 could be employed instead of the wire 31 where it is desired to minimize the number of inner layers, and the wire 31 may be disposed partially or completely above the external surfaces where it is desired to minimize the footprint of the magnetic component on the PCB. For example, the wire 31 may be coiled axially instead of or in addition to being coiled radially as in the spiral configuration.

The terms and expressions which have been employed in the foregoing specification are used therein as terms of description and not of limitation, and there is no intention of the use of such terms and expressions of excluding equivalents of the features shown and described or portions thereof, it being recognized that the scope of the invention is defined and limited only by the claims which follow.

What is claimed is:

1. A method for forming a magnetic component on a printed circuit board, comprising mounting a magnetic component on the printed circuit board, providing the circuit board with a conductive trace so that a first winding of the magnetic component includes said conductive trace, and disposing a first wire on an external surface of the printed circuit board so that a second winding of the magnetic component includes said wire.

2. The method of claim 1, wherein said wire is provided with insulation.

3. The method of claim 1, further comprising providing an inner layer of the printed circuit board and forming said trace on said inner layer.

4. The method of claim 1, further comprising tacking said first wire to said external surface with an adhesive.

5. The method of claim 1, further comprising providing a second wire so that a third winding of the magnetic component includes said second wire, and disposing said second wire on a second, opposite external surface of the printed circuit board.

6. The method of claim 1, further comprising interconnecting an electrical component to the magnetic component by soldering a lead of the electrical component directly to an end of said first wire.

7. An apparatus for forming a magnetic component, comprising a printed circuit board, a magnetic element, and a first wire, wherein said printed circuit board includes a conductive trace, wherein a first winding of said magnetic component includes said trace, wherein a second winding of said magnetic component includes said wire, and wherein said wire is disposed on an external surface of said printed circuit board.

8. The apparatus of claim 7, wherein said printed circuit board has an inner layer, and wherein said trace is formed on said inner layer.

9. The apparatus of claim 7, wherein said wire is attached to said exterior surface with an adhesive.

10. The apparatus of claim 7, wherein said wire is attached to said exterior surface with a fastening means.

11. The apparatus of claim 7, wherein said wire is held against said exterior surface of said printed circuit board.

12. The apparatus of claim 7, further comprising a second wire disposed on an opposite external surface of said printed circuit board, a third winding of said magnetic component including said second wire.

13. The apparatus of claim 7, further comprising an electrical shield element disposed over said wire.

14. The apparatus of claim 7, wherein said magnetic component includes a ferrite core, and wherein said printed circuit board includes cut-out areas to permit at least a portion of said ferrite core to extend through said printed circuit board.

* * * * *